United States Patent [19]

Crochet et al.

[11] 4,249,264
[45] Feb. 3, 1981

[54] METHOD AND SYSTEM FOR TRANSMITTING SIGNALS BY FIBER OPTICS

[75] Inventors: Michel Crochet, Verneuil-sur-Seine; Georges Lecot, Marly-le-Roi, both of France

[73] Assignee: Thomson-CSF, France

[21] Appl. No.: 814,811

[22] Filed: Jul. 11, 1977

[30] Foreign Application Priority Data

Aug. 6, 1976 [FR] France .................. 76 24153

[51] Int. Cl.$^3$ .............................. H04B 9/00
[52] U.S. Cl. ...................... 455/612; 455/613; 455/617
[58] Field of Search .................. 250/199, 214 AG; 179/15 BP, 16 F; 455/612, 613, 617

[56] References Cited

U.S. PATENT DOCUMENTS

| 2,757,239 | 7/1956 | Patton | 179/15 BP |
| 2,965,717 | 12/1960 | Bell | 179/15 BP |
| 3,546,465 | 12/1970 | Arnaud | 250/199 |
| 3,919,640 | 11/1975 | Simciak | 325/30 |
| 4,015,118 | 3/1977 | Andersson et al. | 250/211 J |
| 4,070,572 | 1/1978 | Summerhayes | 250/199 |

OTHER PUBLICATIONS

Blackburn–A 120 mHz Bandwidth Linear Signal Transmission System Using Fiber Optics–IEEE Trans. on Instru. & Measurement, vol. 1m-24, #3-Sep. 1975, pp. 230-232.

Kudo—New Fiber Cable Transmission Systems Use Led Semiconductor Laser as the Optical Source—IEE—#115, pp. 42-46-Jul. 1976.

*Primary Examiner*—Benedict V. Safourek
*Assistant Examiner*—Joseph A. Orsino, Jr.
*Attorney, Agent, or Firm*—Karl W. Flocks

[57] ABSTRACT

In the transmitter, a reference signal, produced by a voltage-controlled oscillator whose frequency is controlled by the battery voltage, is applied together with the signal to be transmitted to the transmission light emitting diode. In the receiver, the signal received is applied to a high-pass filter delivering the useful signal and to a low-pass filter reforming the reference signal. The same is compared with a predetermined voltage and the error signal is used for polarizing the reception diode and thereby maintaining constant the overall gain of the transmission channel. The output of the filter is also applied to a device controlling the voltage of the battery by measuring the frequency of the signal applied thereto.

3 Claims, 1 Drawing Figure

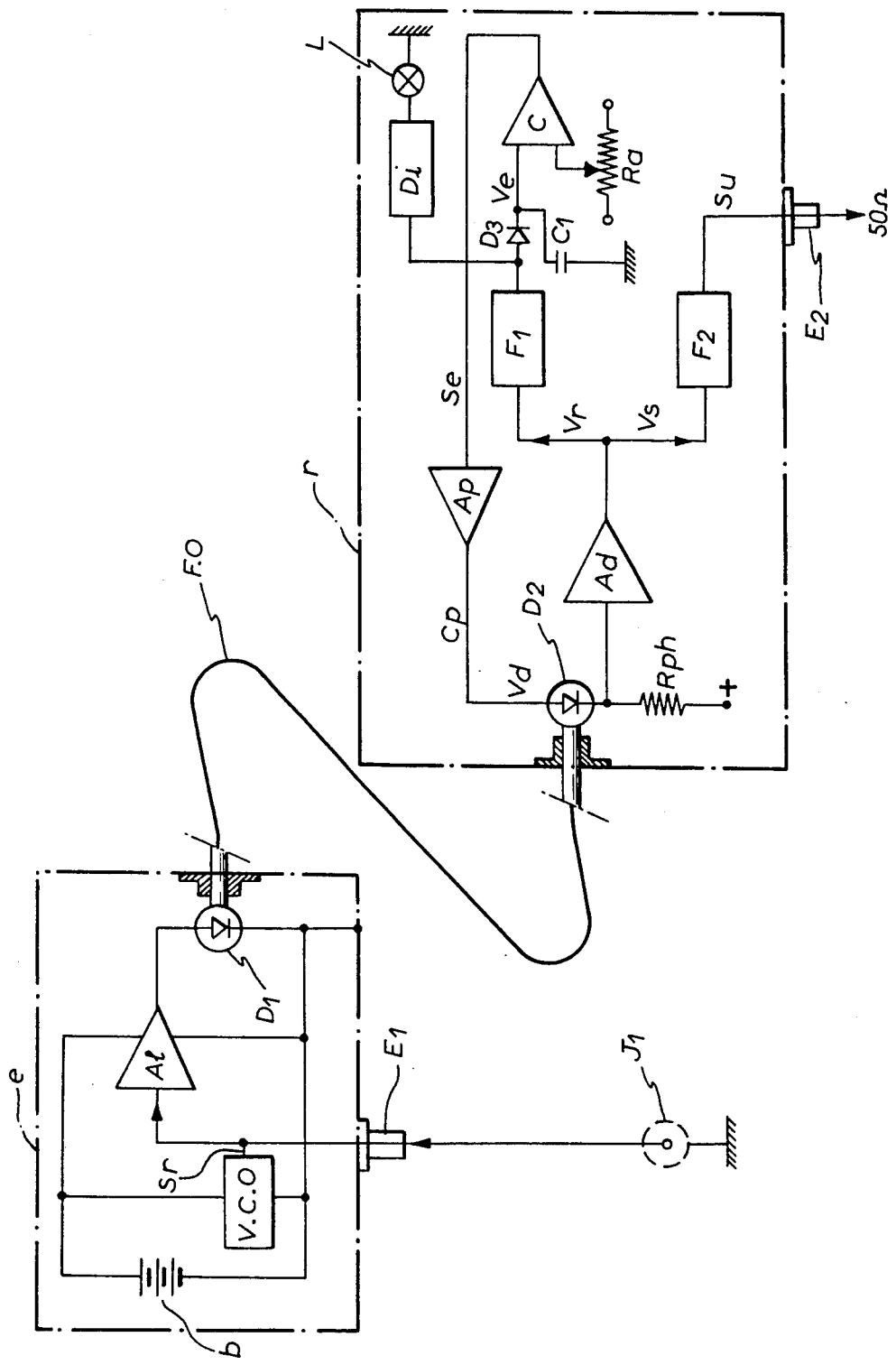

METHOD AND SYSTEM FOR TRANSMITTING SIGNALS BY FIBER OPTICS

The present invention relates to a method and system for transmitting signals by fiber optics.

The transmission of signals, and of analog signals in particular, using fiber optics, offers certain advantages over transmission by coaxial cables:

- it insures independence of the reference potentials of the transmitter and the receiver,
- it provides excellent protection against electromagnetic interference.

On the other hand, certain problems arise in connection with transmission proper, regardless of whether the signal is of the digital or analog type.

The transmission of digital signals merely calls for the recognition of two levels, corresponding respectively to the presence or absence of the light signal, and recourse is had to the familiar forms of modulation, namely frequency modulation, pulse-time modulation, pulse-width modulation and pulse-interval modulation.

In the present state of the art, the transmission of analog signals is reduced to the on/off form owing to certain difficulties which arise from the analog nature and passband (video signals up to 100 MHz) of the signal to be transmitted and because of variations stemming from the transmission components themselves.

For considering that:

the dynamic transmission range must be wide enough;

linearity must be protected if possible;

the channel gain must be constant as a function of numerous parameters like positioning of the fibers in the connectors or possible breaking of fiber strands;

the circuit must have a wide passband;

and the optronic transducers notably the photoreceivers are sensitive to certain parameters such as temperature and polarizing voltage;

the difficulty of preserving a known and constant gain for the channel as a whole will be appreciated, especially bearing in mind optical-connector connections and disconnections.

The drawback with transmission systems using the types of modulation mentioned precedingly, whether frequency, pulse-time, pulse-width or pulse-interval modulation, is that they limit the bandwith of the useful signal to a relatively small fraction—approximately 20%—of the global system bandwidth.

These forms of modulation cannot be used therefore when the bandwith of the useful signals is of the same order of magnitude as the passband of the available optical transmission channel, or when it is required to make use of the entire available passband.

However, the recent appearance of laser beam diodes with a short response time and of reception photodiodes of very high sensitivity and wide passband has enabled a new approach to be made to the problem.

Thus in an article in 'I.E.E.E. Transactions on Instrumentation and Measurement', September 1975, Vol. IM 24 No. 3, entitled 'A 120 MHz bandwith linear signal transmission system using fiber optics', James C. Blackburn describes a transmissions system using such components.

In a processing channel of this kind, the useful signal is interrupted periodically for transmission of a calibration pulse of known level, thereby making it possible to measure the channel gain and make the necessary correction to the useful signal level received.

This method nevertheless has two major drawbacks that stem from the fact that the useful signal cannot be measured during the duration of the pulse and the scaling correction must be made afterwards by calculation.

This invention provides a method and system for overcoming these two drawbacks while permitting transmission of the useful signal, which signal can be a multiplexed signal of bandwidth virtually equal to that of the transmission channel. The said method consists in adding to the useful signal a reference signal of constant known amplitude, or preferably narrow bandwidth, placed in an unoccupied part of the passband and hence, though not limitatively, usually at either edge of the passband in order to make it possible upon reception to separate the reference signal from the useful signal.

Further, it is an important particularity of this invention that the reference signal separated upon reception is used to automatically slave the gain of the reception means whereby to cause the overall gain of the channel to remain constant.

In accordance with the invention, the reference signal is compared to a voltage of constant amplitude and the resulting error signal controls the reception photodiode polarizing voltage. This permits of taking advantage of the variation in photodiode sensitivity as a function of polarizing voltage, which variation is usually regarded as a drawback but which is put to advantage in the present invention.

The description which follows with reference to the accompanying non-limitative exemplary drawing will give a clear understanding of how the invention can be carried into practice.

In the drawing the single FIGURE illustrates a transmission channel using fiber optics and comprising a diode-type transmitter e and a diode-type receiver r.

The processing channel illustrated in the single FIGURE includes an optical fiber F,O, connecting transmitter e to receiver r.

Transmitter e forms the output element for a detection device to which signal inputs are effected at E1 through connector JI.

Preferably such detection device is the device described by Louis de PUYLAROQUE and Michel CROCHET in the U.S. patent application entitled 'Method of detecting a variable magnetic field and apparatus for performing the same' filed May 12, 1977 under Ser. No. 796,501, now abandoned.

It may be recalled that such detection device which is intended for detecting variable electromagnetic fields includes a detector which delivers a signal proportional to the derivative of the electrical or magnetic component of the field and that the signal is integrated at the level of the detector and then applied to a processing circuit in which it passes through at least one impedance matching means before being applied to said output element.

In accordance with the present invention, the transmitter e is formed by a wideband amplifier A1 biased by the voltage across the terminals of a battery b. The output terminal of this amplifier is electrically connected to the anode of a transmission light emitting diode D1 having its cathode electrically connected to the negative terminal of battery b.

The input terminal of amplifier A1 is connected to transmitter input E1, to which the signal to be transmitted is applied. Simultaneously, the amplifier input is electrically connected to the output of a voltage-controlled oscillator (hereinafter referred to as VCO) controlled by the voltage from battery b, and across the terminals of which it is connected to supply a reference signal Sr.

As well known per se (though not shown in the drawing), amplifier A1 comprises a voltage amplifier stage and three current amplifier stages, thereby to enable transmitting diode D1 to be driven by an appropriate current.

The voltage amplifier stage further permits of so adjusting the response curve of transmitter e as to obtain the required passband through the emitter decoupling of the first transistor of amplifier A1 as is well known to the specialist in the art. The current amplifier may include, as well known per se, two Darlington stages and a control transistor.

Since the system must transmit positive or negative signals amplifier A1 operates in the Class A mode around a current biasing point.

A resistor (not shown), series-connected with the emitter of the control transistor permits, as is well known, of obtaining a linear response to current, and its relatively high rating reduces the power circuit response time due to the natural impedance of the connections.

Diode D1 can be selected so as to have a short response time of say less than five nonoseconds.

As stated precedingly in order to insure constant gain for the channel slaving means control the transfer function of receiver r. Accordingly, the reference signal Sr (at 500 Hz for example) continuously modulates, at a constant level, diode D1 in transmitter e through the agency of amplifier A1. This signal Sr is filtered within receiver r and controls the bias of a reception diode D2 in such manner that the channel gain remains constant even if the characteristics of the optical link should vary through, say breakage of an optical fiber or displacement thereof in relation to the diodes, or because of a modification in its characteristics due to the temperature. Further the reference signal Sr, the frequency of which depends on the voltage of battery b feeding transmitter e allows of detecting a state of discharge of said battery below a certain threshold.

Reference signal Sr is generated within transmitter e by the VCO controlled by a voltage and formed, as well known per se, by two amplifiers (not shown) connected in a multivibrator configuration.

Within the oscillator, frequency control is accomplished as well known per se, by biasing the input of one of the amplifiers by means of a voltage proportional to the supply voltage from battery b in such manner as to obtain 500 Hz, for example, for a battery voltage of 24 volts. When the battery voltage drops, the VCO delivers a signal of constant level but of frequency which diminishes progressively, and the system is adjusted so that the frequency should be 300 Hz say, for a voltage across the terminals of battery b of 22 volts.

A second-order-low-pass filter (not shown) in the VCO suppresses the high-frequency components of the oscillator signal, whereby the output signal Sr is substantially sinusoidal. This signal is then applied to the input of amplifier A1 controlling diode D1, which diode is thus continuously modulated by said references signal Sr. Receiver r can be split into three parts: an amplifier, a servo loop and the transmitter battery charge detection means.

The amplifier comprises receiver diode D2, which may be of the avalanche type and which is reverse-biased between a fixed positive high voltage of a few hundred volts (400 volts for instance) and a voltage variable from 0 volts to about +100 volts generated by the servo loop.

Thus, in the illustrated form of embodiment, the anode of diode D2 is connected to the output of the servo loop, and its cathode is connected through a load resistor Rph of a few tens of ohms, to a positive voltage source of about 400 V.

Manifestly, the cathode of diode D2 could alternatively be connected to the servo loop and its anode to a fixed voltage (being grounded for example), the important thing being that the voltage across the terminals of diode D2 should vary as a function of a signal delivered by the servo loop.

The amplifier further includes an amplifier Ad having two stages for example and comprising, as well known per se, a transistor for correcting the response curve and a video amplifier. In the illustrated embodiment, the input terminal of amplifier Ad is connected to the cathode of diode D2 and its output is connected to the following two channels:

The 'reference' channel Vr which applies the output signal from amplifier Ad to the input of filter F1 and thus to the servo loop.

The 'signal' channel Vs which applies the output signal from amplifier Ad to the input of filter F2. The latter is a high-pass filter that eliminates the component corresponding to the reference signal from the signal applied to it. An impedance matching stage (not shown) is connected to the output terminal of filter F2 and its own output is connected to the receiver output E2, where the useful signal Su is delivered at an impedance of 50 ohms.

The servo loop includes filter F1, which is a low-pass filter having its output connected via a diode D3 to one input of an error detector C which is grounded through a filtering capacitor C1. The other input of error detector C is connected to the movable terminal of a potentiometer Ra connected across two determinate voltage sources, such as ground potential and a positive potential. Thus the level of the output signal from filter F1 is compared to a direct-current voltage whose amplitude is adjustable and set by potentiometer Ra. Detector C delivers an output error signal Se which is applied to an amplifier Ap the output from which is applied to the anode of photodiode D2 through the channel Cp for controlling the bias of said diode.

Thus the reference signal reformed from the signal issuing from amplifier Ad is filtered, amplified and then detected and compared with an adjustable DC voltage. The error signal generated by detector C is then applied to diode D2. Amplifier Ad could for instance be a transistor having its base forming the amplifier input, its collector the amplifier output (said collector being connected to a voltage source of about 100 volts through a load resistor) and having its emitter grounded.

In the event that the servo loop output is applied to the cathode of diode D2, instead of to the anode thereof as in the illustrated embodiment, the transistor forming amplifier Ap would have to withstand a very high voltage (several hundred volts). In contrast, the transistor used in the illustrated embodiment can be a transistor of less power, hence less costly, since it is required to withstand only about 100 volts.

When the channel gain tends to decrease, for instance because the optical fiber is poorly positioned in relation to diodes D1 or D2, the level of the signal corresponding to the reference signal at the input to error detector C decreases and detector C then delivers a signal which saturates the bias control transistor Ap. The anode voltage of diode D2 tends toward zero, and the cathode being at maximum voltage causes the total voltage across the diode terminals to increase, thereby causing a proportional increase in optical sensitivity and thus compensating for the loss of gain.

With an open loop, and if diode D2 is biased by a voltage Vdo, the reference signal measured at the input to error detector C is Veo. If the diode bias is varied, then the following will be obtained for small variations:

$$Ve = Veo + K(Vd - Vdo) \qquad (1)$$

$K = (\Delta Ve / \Delta Vd)$ being characteristic of the response/diode-bias curve and of the gain of the direct slaving channel.

Similarly, if Ve varies for any reason, then the diode bias will be varied in such manner that $$Vd = Vdo + A(Ve - V_{ref})$$

where $A = (\Delta Vd / \Delta Ve)$ (2)

In the closed-loop mode, the following will be obtained from (1) and (2) above:

$$Ve = \frac{Veo}{1 - KA} - \frac{KA}{1 - KA} V_{ref}$$

If the gain of loop KA is high, then:

$$Ve \neq V_{ref}$$

Since reference signal Sr modulating the transmitter is assumed to be constant insofar as its maximum amplitude is concerned (the signal being an alternating-current signal), it will be appreciated that the channel gain latches onto this reference signal.

In reality, the dynamic range of the slaving function is limited by the non-linearity of the voltage/diode-D2 sensitivity response because the coefficient varies greatly with the operating point of said diode.

Detection of the transmitter battery charge is provided by the fact that the reference signal Sr, which is normally at 500 Hz when the battery is at 24 volts, has its frequency drop to 300 Hz when the battery b drops to 22 volts. The output from filter F1 is applied to the input of a pulse integrating discriminator Di, whereby the frequency of this signal is measured in the receiver by said discriminator, with each transition through zero of the signal triggering a monostable circuit subsequent to shaping by a transistor (not shown).

Within discriminator Di, the mean value of the output signal from the monostable circuit is filtered, then compared to a threshold, whereby an indicator light L, connected between the output terminal of the discriminator and ground, lights up when said value drops below said threshold.

Obviously, the error signal Se could be used to control any other automatic gain control means such as a controlled-gain simplifier, an adjustable attenuator with a PIN or other diode, or a plurality of such means if it is required to have a wide dynamic range.

It is equally manifest that the reference signal Sr could itself be modulated in any convenient manner, thereby possibly enabling it to transmit data in addition to the main signal.

In order to provide for the possibility of the useful signal dropping to zero frequency and hence having a DC component, the reference signal Sr, which could be a sine wave, could be positioned at the upper end of the transmission channel band insofar as its frequency is concerned.

Conversely, should the useful signal not include a DC component, reference signal Sr is placed at the lower end of the transmission channel band insofar as frequency is concerned.

It goes without saying that changes and substitutions may be made in the embodiment hereinbefore described without departing from the scope of the invention as set forth in the appended claims.

We claim:

1. An analogic signal transmitting system of the kind comprising a transmitter with a light emitting diode and energized by a battery, and a receiver with a reception photodiode having two terminals, said light emitting diode and reception photodiode being connected by optical fibers, and in which the signal to be transmitted to the receiver output is applied to the transmitter input, comprising:

an oscillator producing a reference signal and having its output connected to the light emitting diode, said reference signal being superimposed upon the signal to be transmitted, said oscillator being an oscillator having its frequency controlled by the battery voltage;
   an error detector having two inputs and an output;
   a reference signal reforming filter;
   a second filter having its input connected to the input of the reference signal reforming filter and its output connected to the receiver output;
   means connecting the inputs of the filters to one of the terminals of the reception photodiode;
   means connecting one of the error detector inputs to the reference signal reforming filter output;
   means connecting the second error detector input to a source of predetermined voltage;
   means modifying the level of the signal delivered by the reception photodiode and linked to the error detector output;
   and means indicating the level of the battery charge and comprising a pulse integrating discriminator having its input linked to the output of one of the filters and an indicator light associated to the output terminal of the discriminator whereby to be activated if the mean value of the output signal from the discriminator is less than a predetermined threshold.

2. An analogic signal transmitting system of the kind comprising a transmitter with a light emitting diode and energized by a battery, and a receiver with a reception photodiode having two terminals, said light emitting diode and reception photodiode being connected by optical fibers, and in which the signal to be transmitted to the receiver output is applied to the transmitter input, comprising:

an oscillator producing a reference signal and having its output connected to the light emitting diode, said reference signal being superimposed upon the signal to be transmitted, said oscillator being an oscillator having its frequency controlled by the battery voltage;

an error detector having two inputs and an output;
a reference signal reforming low-pass filter;
a high-pass filter having its input connected to the input of the low-pass filter and its output connected to the receiver output;
means connecting the inputs of the filters to one of the terminals of the reception photodiode;
means connecting one of the error detector inputs to the low-pass filter output;
means connecting the second error detector input to a source of predetermined voltage;
means modifying the level of the signal delivered by the reception photodiode and linked to the error detector output;
and means indicating the level of the battery charge and comprising a pulse integrating discriminator having its input linked to the output of one of the filters and an indicator light associated to the output terminal of the discriminator whereby to be activated if the mean value of the output signal from the discriminator is less than a predetermined threshold.

3. An analogic signal transmitting system in which a signal applied to the input of a transmitter is transmitted to the output of a receiver, comprising
a transmitter including
a light emitting diode,
a battery energizing said light emitting diode,
an oscillator producing a reference signal and having its frequency controlled by the voltage of said battery with the output of said oscillator connected to said light emitting diode, said reference signal being superimposed upon the signal to be transmitted;
a receiver including
a reception diode having two terminals;
optical fibers connecting said light emitting dioide and said reception diode;
said receiver further including
an error detector having two inputs and an output,
a reference signal reforming filter having an output connected to one of said inputs of said error detector,
a source of predetermined voltage connected to the other of said inputs of said error detector,
a second filter having an input connected to an input of said reference signal reforming filter and an output connected to an output of said receiver,
said filters having their inputs connected to one of said terminals of said reception diode,
means modifying the level of the signal delivered by said reception diode connected to said output of said error detector and a said terminal of reception diode,
a pulse integrating discriminator having an input connected to an output of one of said filters,
and means indicating the threshold level of an output signal from said discriminator connected to an output of said discriminator.

* * * * *